(12) United States Patent
Watanabe et al.

(10) Patent No.: US 9,111,493 B2
(45) Date of Patent: Aug. 18, 2015

(54) DISPLAY DEVICE

(75) Inventors: Hisashi Watanabe, Osaka (JP); Kenji Okamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 188 days.

(21) Appl. No.: 13/822,728

(22) PCT Filed: Sep. 9, 2011

(86) PCT No.: PCT/JP2011/070580
§ 371 (c)(1),
(2), (4) Date: Mar. 13, 2013

(87) PCT Pub. No.: WO2012/036081
PCT Pub. Date: Mar. 22, 2012

(65) Prior Publication Data
US 2013/0176352 A1    Jul. 11, 2013

(30) Foreign Application Priority Data
Sep. 14, 2010    (JP) .................. 2010-205088

(51) Int. Cl.
*G09G 3/34*     (2006.01)
*H05K 7/02*     (2006.01)
*G02F 1/1333*   (2006.01)

(52) U.S. Cl.
CPC ............. *G09G 3/34* (2013.01); *G02F 1/13336* (2013.01); *H05K 7/026* (2013.01); *G02F 2201/44* (2013.01); *G09G 2300/026* (2013.01); *G09G 2310/0232* (2013.01)

(58) Field of Classification Search
None
See application file for complete search history.

(56) References Cited

U.S. PATENT DOCUMENTS 6,614,171 B2    9/2003    Rajeswaran et al.
8,411,987 B2 *  4/2013    Han et al. ............ 382/274

(Continued)

FOREIGN PATENT DOCUMENTS

JP    2000-305491 A    11/2000
JP    2001-343599 A    12/2001

(Continued)

OTHER PUBLICATIONS

English translation of Official Communication issued in corresponding International Application PCT/JP2011/070580, mailed on Apr. 18, 2013.

(Continued)

*Primary Examiner* — Peter Vincent Agustin
(74) *Attorney, Agent, or Firm* — Keating & Bennett, LLP

(57) ABSTRACT

A direct-viewing type display device (100) includes: first and second display panels (10*a*, 20*a*); and a joint region (10Jab) containing a linking portion (10*ab*) which links together the first frame region (10*a*F) and the second frame region (10*b*F) and containing the first and second frame regions (10*a*F, 10*b*F). The first display region (10*a*D) of the first display panel (10*a*) has a first peripheral display region (10*a*D$_{Pa}$) which adjoins the first frame region (10*a*F) and a first middle display region (10*a*DC) which adjoins the first peripheral display region (10*a*D$_{Pa}$). Each region has a plurality of unit-regions, and an average luminance L$_{Pa}$ of a plurality of first peripheral unit-display regions (10*a*D$_{Pa}$-UA) contained in the first peripheral display region (10*a*D$_{Pa}$) is higher than an average luminance L$_{Ca}$ of a plurality of first middle unit-display regions (10*a*DC-UA) contained in the first middle display region (10*a*DC).

11 Claims, 8 Drawing Sheets

(56) References Cited

U.S. PATENT DOCUMENTS

| | | | |
|---|---|---|---|
| 2003/0025442 A1 | 2/2003 | Takeuchi et al. | |
| 2005/0248274 A1* | 11/2005 | Park | 313/582 |
| 2008/0088588 A1* | 4/2008 | Kitaura | 345/158 |
| 2010/0013810 A1* | 1/2010 | Chung et al. | 345/207 |
| 2010/0265227 A1* | 10/2010 | Lan et al. | 345/207 |
| 2011/0242686 A1* | 10/2011 | Watanabe | 359/804 |
| 2012/0139885 A1* | 6/2012 | Iwasa et al. | 345/207 |
| 2013/0176352 A1* | 7/2013 | Watanabe et al. | 345/690 |

FOREIGN PATENT DOCUMENTS

| | | |
|---|---|---|
| JP | 2002-304135 A | 10/2002 |
| JP | 2004-191487 A | 7/2004 |
| JP | 2005-003990 A | 1/2005 |
| JP | 2006-047845 A | 2/2006 |
| WO | 2010/070871 A1 | 6/2010 |

OTHER PUBLICATIONS

Official Communication issued in International Patent Application No. PCT/JP2011/070580, mailed on Oct. 18, 2011.

Zsivanov et al., "Novel Approach to Camouflaging Seams in Tiled-Display Applications", SID 10 Digest, 2010, pp. 846-847.

* cited by examiner

FIG.9
(a)
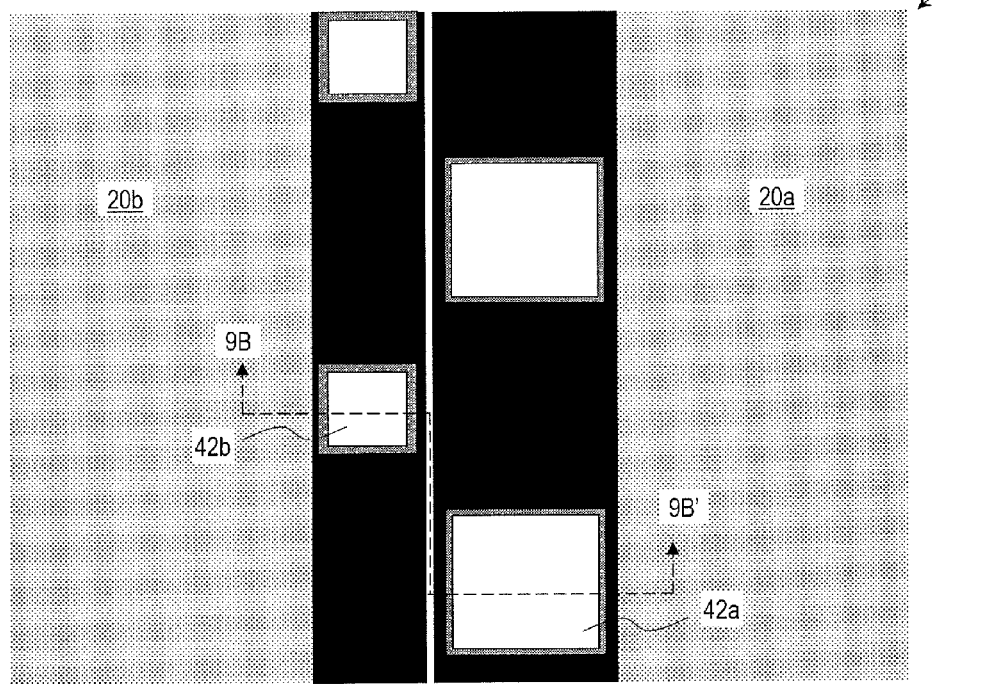
(b)
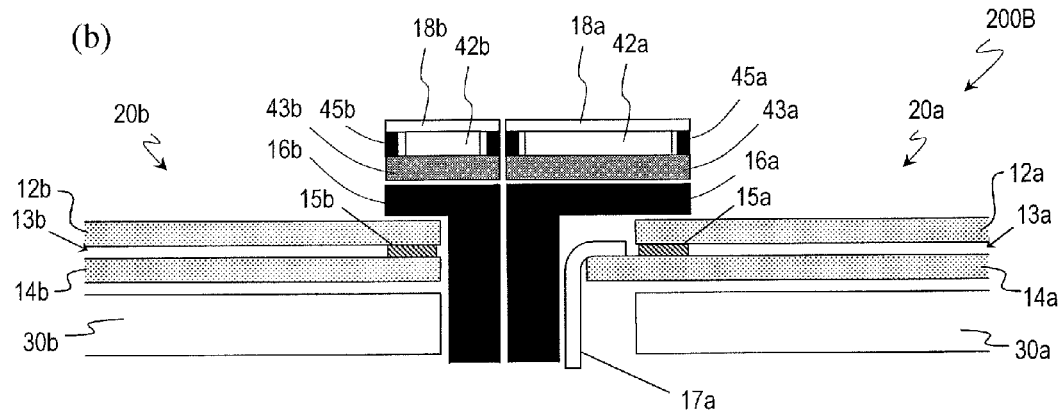

DISPLAY DEVICE

TECHNICAL FIELD

The present invention relates to a display device, and more particularly to a direct-viewing type display device.

BACKGROUND ART

In recent years, there is a strong desire for an increase in the size of television sets and display devices for displaying information. Representative examples of large-sized display devices are display devices in which self-light-emitting elements such as light-emitting diodes (LEDs) are arranged in a matrix array and projection display devices; however, these have disadvantages in terms of image quality. Therefore, a further increase in the size of direct-viewing type liquid crystal display devices (LCDs) and plasma display devices (PDPs), which are capable of displaying with a high image quality, is being desired.

Since a direct-viewing type liquid crystal display device or a plasma display device is basically formed on a glass substrate, its screen size depends on the substrate size. Currently, the largest of glass substrates (mother substrates) that are used for the production of liquid crystal display devices are those of the eighth generation (2200 mm×2400 mm), and liquid crystal display devices whose diagonal is about 100 inches are being produced by using these substrates. The substrates that are available for mass production will become more increased in size, however at a slow rate. It is difficult to immediately provide display devices with the larger areas that are required on the current market.

Therefore, as a method of realizing a large-screen display device, there has been a conventional attempt of realizing a make-believe large-screen display device by arraying a plurality of display devices (which may be referred to as tiling). However, the tiling technique induces a problem of visible joints between the plurality of display devices. This problem will be described by taking a liquid crystal display device for example.

Note that a liquid crystal display device mainly includes a liquid crystal display panel, a backlight device, circuits for supplying various electrical signals to the liquid crystal display device, and a power supply, as well as a housing in which to accommodate these. The liquid crystal display panel is mainly composed of a pair of glass substrates and a liquid crystal layer retained therebetween. On one of the glass substrates, a color filter layer and a counter electrode are formed, while on the other glass substrate, TFTs, bus lines, a driving circuit for supplying signals to them, and the like are formed. The screen size of a direct-viewing type liquid crystal display device is determined by the screen size of its liquid crystal display panel. Moreover, the liquid crystal display panel has a display region composed of a plurality of pixels, and a frame region surrounding it. In the frame region, a sealing portion for attaching together the pair of substrates and also sealing and retaining the liquid crystal layer, an implementation of driving circuitry for driving the pixels, and the like are formed.

Thus, since the frame region not contributing to any displaying exists in a liquid crystal display panel, when a large screen is constructed by arraying a plurality of liquid crystal display panels, the image will have joints. This problem is not limited to liquid crystal display devices, but is shared among direct-viewing type display devices, e.g., PDPs, organic EL display devices, and electrophoresis display devices.

The Applicants disclosed on Jun. 7, 2010 a multi display system in which a plurality of 60V-type liquid crystal display panels were deployed in matrix tiling, with a width (also referred to as a "system frame width") of 6.5 mm existing between adjacent display regions (where each single display panel had a frame region which was 2.4 mm wide in the right side and the lower side and 4.1 mm wide in the left side and the upper side) (http://www.sharp.co.jp/corporate/news/100607-a.html). This multi display system has the smallest system frame width ever, and its joints are not too conspicuous. However, there is a desire for developing a display device with further obscured joints.

Patent Document 1 discloses a display device which realizes jointless displaying by further providing a display panel at the rear face of two or more display panels.

Non-Patent Document 1 describes that it is possible to obscure joints by allowing a noise component to be contained in signals for displaying in the display region near joints.

CITATION LIST

Patent Literature

[Patent Document 1] Japanese Laid-Open Patent Publication No. 2002-304135

Non-Patent Literature

[Non-Patent Document 1] Delia Zsivanov et al., SID 10 DIGEST, P. 846-P. 847, Novel Approach to Camouflaging Seams in Tiled-Display Applications

SUMMARY OF INVENTION

Technical Problem

However, the display device described in Patent Document 1 has a problem in that it requires a display panel to be disposed on the rear face, thus resulting in a high cost. On the other hand, the technique described in Non-Patent Document 1 allows the noise to be observed in the form of light spots or dark spots, which may be perceived as displaying unevenness.

The present invention aims at providing a direct-viewing type display device whose joints are obscured by a method which is distinct from the aforementioned conventional techniques.

Solution to Problem

A display device according to a first invention comprises: a first display panel having a first display region and a first frame region formed outside the first display region, the first frame region extending along a first axis; a second display panel having a second display region and a second frame region formed outside the second display region, the second frame region extending along the first axis; a joint region containing a linking portion, the first frame region of the first display panel, and the second frame region of the second display panel, the linking portion linking together the first frame region and the second frame region, wherein, the first display region has a first peripheral display region which adjoins the first frame region along a second axis intersecting the first axis, and a first middle display region which adjoins the first peripheral display region along the second axis; the second display region has a second peripheral display region which adjoins the second frame region along the second axis and a second middle display region which adjoins the second peripheral display region along the second axis; each of the first display region, the second display region, the first frame region, and the second frame region has a plurality of unit-regions, each unit-region being a region of variable luminance and defining a smallest region that serves as a reference in making luminance comparison with another region; and an average luminance of a plurality of first peripheral unit-display regions contained in the first peripheral display region, corresponding to input image data of a given gray scale level, is higher than an average luminance of a plurality of first middle unit-display regions contained in the first middle display region.

In one embodiment, $(L_{Fa} \cdot d_{Fa} + L_{Pa} \cdot d_{Pa})(d_{Fa} + d_{Pa}) = L_{oa}$ is satisfied where, corresponding to input image data of a given gray scale level, $L_{Ca}$ is an average luminance of the plurality of first middle unit-display regions; $L_{Pa}$, is an average luminance of the plurality of first peripheral unit-display regions; $d_{Pa}$ is an average width of the first peripheral display region; $L_{Fa}$ is an average luminance of a plurality of first frame unit-regions contained in the first frame region; and $d_{Fa}$ is an average width of the first frame region. "·" indicates multiplication.

In one embodiment, the relationship $d_{Fa} < d_{Pa} < 4d_{Fa}$ is satisfied.

In one embodiment, corresponding to input image data of a given gray scale level, an average luminance of a plurality of second peripheral unit-display regions contained in the second peripheral display region is higher than an average luminance of a plurality of second middle unit-display regions contained in the second middle display region. In the case where three or more display panels are provided, the above-described constitution may be adopted for the respective frame regions of display panels that are linked to each other.

In one embodiment, $(L_{Fb} \cdot d_{Fb} + L_{Pb} \cdot d_{Pb})/(d_{Fb} + d_{Pb}) = L_{Cb}$ is satisfied where, corresponding to input image data of a given gray scale level, $L_{Cb}$ is an average luminance of the plurality of second middle unit-display regions; $L_{Pb}$ is an average luminance of the plurality of second peripheral unit-display regions; $d_{Pb}$ is an average width of the second peripheral display region; $L_{Fb}$ is an average luminance of a plurality of second frame unit-regions contained in the second frame region, and $d_{Fb}$ is an average width of the second frame region.

In one embodiment, the relationship $d_{Fb} < d_{Pb} < 4d_{Fb}$ is satisfied.

In one embodiment, the relationships $d_J/2 < d_{Pa} < 2d_J$ and $d_J/2 < d_{Pb} < 2d_J$ are satisfied where $d_J$ is an average width of the joint region.

In one embodiment, the first peripheral display region has a varying width along the first axis. For example, an edge of the first peripheral display region flush to the first middle display region is undulated along the first axis (e.g. a sine wave).

In one embodiment, corresponding to input image data of a given gray scale level, the plurality of first peripheral unit-display regions have a distribution of luminance which is higher toward the first frame region and lower toward the first middle display region. For example, the first peripheral display region may be divided into a plurality of subregions which are arranged along the second axis, the first peripheral unit-display region having the same luminance within each subregion, such that the luminance of the first peripheral unit-display region becomes higher in subregions which are closer to the first frame region and that the luminance of the first peripheral unit-display region becomes lower in subregions which are closer to the first middle display region.

In one embodiment, the display device further includes a backlight; and light being emitted from the backlight and entering the first peripheral display region has a luminance which is higher than a luminance of light being emitted from the backlight and entering the first middle display region.

In one embodiment, the first frame region and the second frame region are black and antireflection-treated.

A display device according to a second invention comprises: a first display panel having a first display region and a first frame region formed outside the first display region, the first frame region extending along a first axis; a second display panel having a second display region and a second frame region formed outside the second display region, the second frame region extending along the first axis; a joint region containing a linking portion, the first frame region of the first display panel, and the second frame region of the second display panel, the linking portion linking together the first frame region and the second frame region, wherein the display device further comprises a plurality of first light sources disposed in the first frame region.

In one embodiment, the plurality of first light sources are arranged along the first axis at a constant pitch.

In one embodiment, each of the first display region, the second display region, the first frame region, and the second frame region has a plurality of unit-regions, each unit-region being a region of variable luminance and defining a smallest region that serves as a reference in making luminance comparison with another region; and an average luminance of a plurality of first frame unit-regions contained in the first frame region, corresponding to input image data of a given gray scale level, is equal to an average luminance of a plurality of first unit-display regions contained in the first display region.

In one embodiment, the display device further comprises a plurality of second light sources disposed in the second frame region.

In one embodiment, the plurality of second light sources are arranged along the first axis at a constant pitch, and an array of the plurality of first light sources and an array of the plurality of second light sources are offset by a half pitch.

In one embodiment, the plurality of first light sources and the plurality of second light sources are arranged in a matrix array. Herein, the plurality of first light sources and the plurality of second light sources include multiple LEDs, and are capable of color displaying.

In one embodiment, each of the first display region, the second display region, the first frame region, and the second frame region has a plurality of unit-regions, each unit-region being a region of variable luminance and defining a smallest region that serves as a reference in making luminance comparison with another region; and an average luminance of a plurality of joint unit-regions contained in the joint region, corresponding to input image data of a given gray scale level, is equal to an average luminance between an average luminance of a plurality of first unit-display regions contained in the first display region and a plurality of second unit-display regions contained in the second display region.

In one embodiment, the display device further comprises a light guide disposed in the first frame region.

The first invention and the second invention may be combined. For example, in a display device according to an embodiment of the first invention, light sources may be provided in the frame region, such that the relational expression $(L_{Fa} \cdot d_{Fa} + L_{Pa} \cdot d_{Pa})/(d_{Fa} + d_{Pa}) = L_{Ca}$ is satisfied, where $L_{Fa}$ is an average luminance of the frame unit-regions in the frame region having the light sources disposed therein.

In one embodiment, the display device further comprises a motion sensor.

Advantageous Effects of Invention

According to the present invention, a direct-viewing type display device with obscured joints is provided.

BRIEF DESCRIPTION OF DRAWINGS

FIG. 9 (a) is a plan view of a liquid crystal display device 200B; and (b) is a schematic cross-sectional view along line along line 9B-9B' in (a).

DESCRIPTION OF EMBODIMENTS

Figure 1:
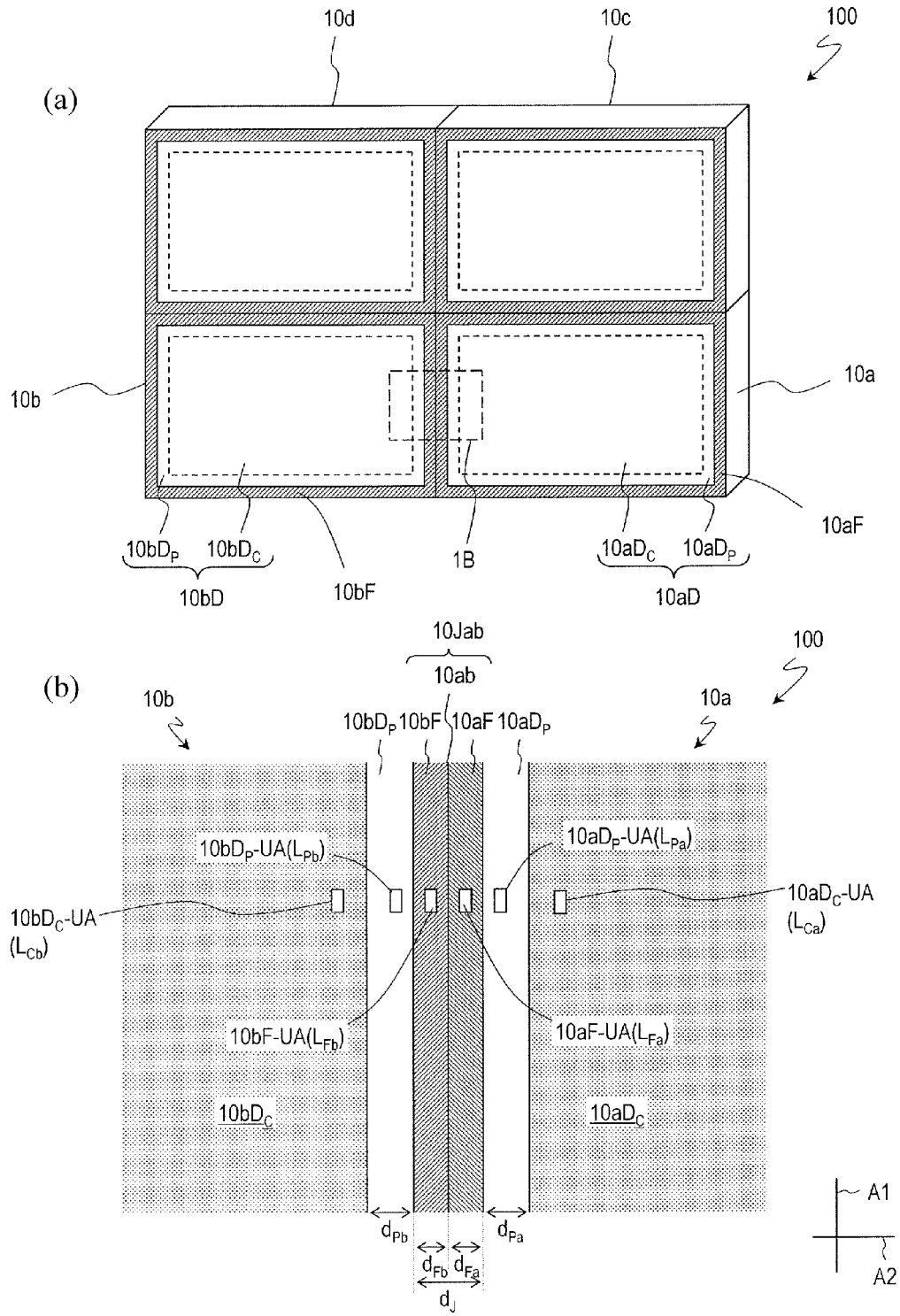
FIG. 1 (a) and (b) are diagrams for describing the structure of a liquid crystal display device 100 according to a first embodiment of the present invention, where (a) is a perspective view; and (b) is an enlarged view of a region 1B indicated by a broken-line rectangle in (a).

Hereinafter, display devices according to embodiments of the present invention will be described with reference to the drawings; however, the present invention is not limited to the illustrated embodiments. Although liquid crystal display devices in which liquid crystal display panels are used will be illustrated as example display devices, this is not a limitation. Any display device employing display panels for PDP, organic EL display panels, electrophoresis display panels, or the like may also be used.

First, with reference to FIG. 1 to FIG. 4, the structure of a liquid crystal display device 100 according to a first embodiment of the present invention as well as the operation thereof will be described.

As shown in FIG. 1(a), the liquid crystal display device 100 includes liquid crystal display panels 10a to 10d, which compose matrix tiling. It will be appreciated that there is no limit to the number of liquid crystal display panels to be included in the liquid crystal display device according to an embodiment of the present invention, and there is no limit to the manner in which they are arrayed. The liquid crystal display panels 10a to 10d, which are disposed so that their respective frame regions are adjacent to one another, are linked together with an adhesive or the like. Herein, the portion composed of an adhesive or the like will be referred to as the linking portion (the linking portion 10ab in FIG. 1(b)).

In the following, the structure of the liquid crystal display panels 10a and 10b and the joint therebetween will be discussed. Since basically the same structure will be shared by any other liquid crystal display panels and joints, their description is omitted. Of course, each liquid crystal display panel may not necessarily be identical with respect to the structure of its right and left shorter sides and upper and lower longer sides (e.g., a circuit board may be mounted only on the left shorter side), but the below-described structure will be readily adapted.

The liquid crystal display panel 10a includes a display region 10aD and a frame region 10aF which is formed on the outside of the display region 10aD. Similarly, the liquid crystal display panel 10b includes a display region 10bD and a frame region 10bF which is formed outside the display region 10bD. As shown in FIG. 1(b), the axis extending along the vertical direction in the display plane is defined as a first axis A1, and the axis extending along the horizontal direction a second axis A2. The liquid crystal display panel 10a and the crystal display panel 10b are adjacent along the second axis A2, being linked to each other via the linking portion 10ab. Within the frame region 10aF of the liquid crystal display panel 10a, the portion which extends along the first axis A1 and which lies next to the liquid crystal display panel 10b will be referred to as a first frame region 10aF. Similarly, within the frame region 10bF of the liquid crystal display panel 10b, the portion which extends along the first axis A1 and which lies next to the liquid crystal display panel 10a will be referred to as a second frame region 10bF. Within the display region 10aD of the liquid crystal display panel 10a, the portion which adjoins the first frame region 10aF along the second axis A2 will be referred to as a first peripheral display region 10aD$_P$, and the portion adjoining the first peripheral display region 10aD$_P$ along the second axis A2 will be referred to as a first middle display region 10aD$_C$. Similarly, within the display region 10bD of the liquid crystal display panel 10b, the portion which adjoins the second frame region 10bF along the second axis A2 will be referred to as a second peripheral display region 10bD$_P$, and the portion adjoining the second peripheral display region 10bD$_P$ along the second axis A2 will be referred to as a second middle display region 10bD$_C$.

A region containing the linking portion 10ab which links together the first frame region 10aF of the liquid crystal display panel 10a and the second frame region 10bF of the liquid crystal display panel 10b and containing the first frame region 10aF and the second frame region 10bF is referred to as a joint region 10Jab. In the liquid crystal display device 100, the joint region 10Jab is obscured in the following manner.

Now, the notion of "unit-region" is introduced in order to express the luminance distribution in each region, and to enable luminance comparison between regions. A unit-region refers to a region (area) of variable luminance, and defines the smallest region (area) that serves as a reference in making luminance comparison with another region. In the display region, the smallest region of variable luminance is a region (pixel region) corresponding to a pixel, and has a geometric area which is derived by adding to the geometric area of the pixel (aperture) the geometric area of any portion around the pixel that does not contribute to displaying (e.g., portions that are shaded by the black matrix (BM) or electrical connection), such addition being made equally to each pixel. In the typical case where pixels are arranged in a matrix array of rows (X direction) and columns (Y direction), the geometric area of a pixel region is expressed as a product of a pitch $P_X$ of the pixels along the X direction and a pitch $P_Y$ of the pixels along the Y direction. The luminance of a pixel region is in proportion to the luminance of the pixel. In the first embodiment, the frame region is a light-shielding region (where e.g., the BM is formed), and the luminance of the frame region is the intensity of reflected ambient light; in the frame region, the smallest region of variable luminance is each "dot" that reflects light, which has a smaller geometric area than does a pixel region. Therefore, in the frame region, the smallest region that serves as a reference in making comparison against the luminance of the pixel region (i.e., the unit-region in the frame region (frame unit-region)) should be a region having the same geometric area as that of the pixel region. The unit-region in the display region (i.e., the unit-display region) is the pixel region.

Note that the color of the frame region is preferably black, and the luminance (reflectance) of the frame region is preferably zero. When the reflectance of visible light in the frame region is sufficiently low, the color of the frame region will not be affected by ambient light, thereby restraining the frame from becoming conspicuous. Moreover, it is preferable that an antireflection treatment and/or an anti-glare treatment be applied to the viewer-side surface of the frame region. These can be performed by known methods.

FIG. 1($b$) shows an enlarged view of a region 1B indicated by a broken-line rectangle in FIG. 1($a$). As shown in FIG. 1($b$), the middle display region $10aD_C$ of the liquid crystal display panel $10a$ has a plurality of middle unit-display regions $10aD_C$-UA; the peripheral display region $10aD_P$ has a plurality of peripheral unit-display regions $10aD_P$-UA; the frame region $10aF$ has a plurality of frame unit-regions $10aF$-UA; and an average luminance of the peripheral unit-display regions $10aD_P$-UA corresponding to input image data of a given gray scale level is higher than an average luminance of the middle unit-display regions $10aD_C$-UA. In other words, when displaying an image which is expressed by input image data of a given gray scale level, it is usually the case that all pixels will exhibit a luminance corresponding to the given gray scale level; however, the liquid crystal display device 100 includes the peripheral display region $10aD_P$, which is composed of the peripheral unit-display regions $10aD_P$-UA having a higher luminance than the luminance of the middle unit-display regions $10aD_C$-UA. Since the peripheral display region $10aD_P$ which is brighter than the middle display region $10aD_C$ adjoins the dark-appearing frame region $10aF$, the viewer will perceive an averaged luminance of the two. As a result of this, the frame region $10aF$ is obscured.

For example, the frame region $10aF$ will be most obscured in the liquid crystal display device 100 when $(L_{Fa} \cdot d_{Fa} + L_{Pa} \cdot d_{Pa})/(d_{Fa}+d_{Pa})=L_{Ca}$ is satisfied, where, corresponding to input image data of a given gray scale level, $L_{Ca}$ is an average luminance of the plurality of middle unit-display regions $10aD_C$-UA, $L_{Pa}$ is an average luminance of the plurality of peripheral unit-display regions $10aD_P$-UA, $d_{Pa}$ is a width of the peripheral display region $10aD_P$, $L_{Fa}$ is an average luminance of the plurality of frame unit-regions $10aF$-UA, and $d_{Fa}$ is a width of the frame region $10aF$, because in this manner an average between the luminance of the frame region $10aF$ and the luminance of the peripheral display region $10aD_P$ equals the luminance of the middle display region $10aD_C$.

If there is no reflection from the frame region $10aF$, then $L_{Fa}=0$, in which case the above equation reads $(L_{Pa} \cdot d_{Pa})/(d_{Fa}+d_{Pa})=L_{Ca}$. Given $d_{Pa}=\alpha \cdot d_{Fa}$, it follows that $L_{Pa}=(1+1/\alpha)L_{Ca}$. In other words, when $\alpha=1$ ($d_{Pa}=d_{Fa}$) for example, $L_{Pa}=2L_{Ca}$. However, too great a difference in luminance from the adjacent region will allow distinct regions to be observed; therefore, it is preferable that $\alpha>1$ ($d_{Pa}>d_{Fa}$), in order to ensure $L_{Ca}<L_{Pa}<2L_{Ca}$.

If the viewer comes too close to the liquid crystal display device 100, the luminance of the frame region $10aF$ and the luminance of the peripheral display region $10aD_P$ will not be averaged out, so that the frame region $10aF$ and the peripheral display region $10aD_P$ will be observed as distinct regions. In order to reduce the distance at which the viewer will perceive the frame region $10aF$ and the peripheral display region $10aD_P$ as distinct regions, it is preferable that the width $d_{Pa}$ of the peripheral display region $10aD_P$ is as small as possible, preferably the less than four times the width $d_{Fa}$ of the frame region $10aF$ ($d_{Pa}<4d_{Fa}$) and more preferably $d_{Pa}<2d_{Fa}$. In other words, it is preferable that $\alpha<4$, and more preferable that $\alpha<2$.

Similarly, the middle display region $10bD_C$ of the liquid crystal display panel $10b$ has a plurality of middle unit-display regions $10bD_C$-UA; the peripheral display region $10bD_P$ has a plurality of peripheral unit-display regions $10bD_P$-UA; and the frame region $10bF$ has a plurality of frame unit-regions $10bF$-UA. In the liquid crystal display panel $10b$, too, similar effects can be obtained by ensuring that an average luminance of the peripheral unit-display regions $10bD_P$-UA corresponding to input image data of a given gray scale level is higher than an average luminance of the middle unit-display regions $10bD_C$-UA. The frame region $10bF$ will be most obscured when $(L_{Fb} \cdot d_{Fb} + L_{Pb} \cdot d_{Pb})/(d_{Fb}+d_{Pb})=L_{Cb}$ is satisfied, where, corresponding to input image data of a given gray scale level, $L_{cb}$ is an average luminance of the plurality of middle unit-display regions $10bD_C$-UA, $L_{Pb}$ is an average luminance of the plurality of peripheral unit-display regions $10bD_P$-UA, $d_{Pb}$ is an average width of the peripheral display region $10bD_P$, $L_{Fb}$ is an average luminance of the plurality of frame unit-regions $10bF$-UA, and $d_{Fb}$ is an average width of the frame region $10aF$, because in this manner an average between the luminance of the frame region $10bF$ and the luminance of the peripheral display region $10bD_P$ equals the luminance of the middle display region $10bD_C$. Herein, it is preferable that $d_{Pb}>d_{Fb}$. Moreover, it is preferable that the width $d_{Pb}$ of the peripheral display region $10bD_P$ is as small as possible, preferably less than four times the width $d_{Fb}$ of the frame region $10bF$ ($d_{Pb}<4d_{Fb}$), and more preferably $d_{Pb}<2d_{Fb}$.

Although the above conditions discuss obscuring the frame regions of the liquid crystal display panels $10a$ and $10b$ each independently, it may be ensured that the relationships $d_J/2<d_{Pa}<2d_J$ and $d_J/2<d_{Pb}<2d_J$ are satisfied for the joint region 10Jab, where $d_J$ is the width of the joint region 10Jab. When $d_{Fa}=d_{Fb}$ and $d_J=d_{Fa}+d_{Fb}$, as is exemplified in FIG. 1($b$), it will be just like the conditions for independently obscuring the frame region of each of the liquid crystal display panels $10a$ and $10b$ as discussed above; however, when the liquid crystal display panels are of asymmetric structure, increased design freedom will be obtained. For example, when $d_{Fa}>d_{Fb}$, it is possible to adopt $d_{Pa}<2d_J$, $d_{Pb}<2\ d_J$, and $d_{Pa}=d_{Pb}$. While the joint region 10Jab will appear dark as one integral piece, the peripheral display region $10aD_P$ and the peripheral display region $10bD_P$, being apart from each other, are more likely to be observed as distinct regions. By ensuring that the peripheral display region $10aD_P$ and the peripheral display region $10bD_P$ are equal in width ($d_{Pa}=d_{Pb}$), such that a symmetric structure is attained with respect to the joint region 10Jab, oddness can be reduced. This is describable as $\alpha=(d_{Pa}+d_{Pb})/d_J$, where $1<\alpha<4$ is satisfied.

Figure 2:
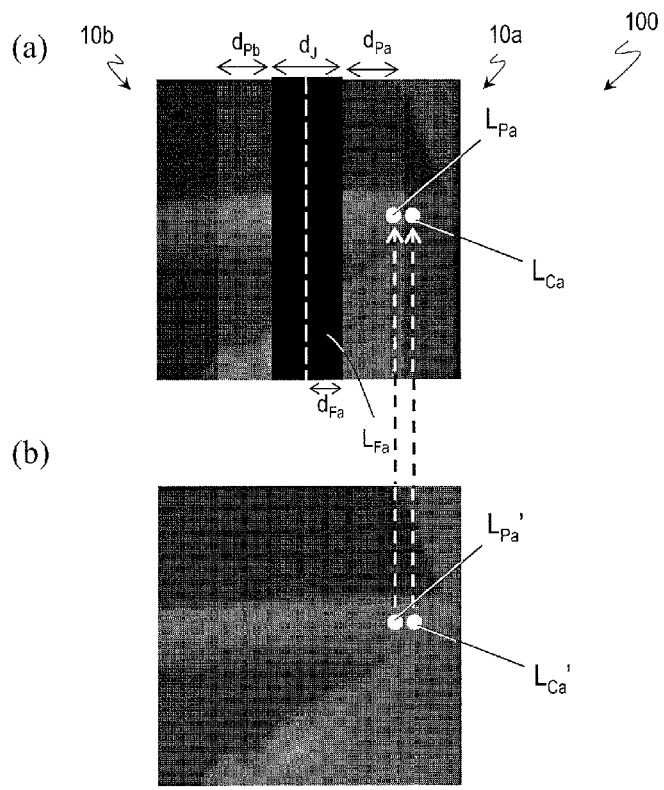
FIG. 2 (a) is a diagram showing an image (luminance distribution) which is displayed near a joint in the liquid crystal display device 100; and (b) is a diagram showing a standard luminance distribution corresponding to input image data.
Figure 3:
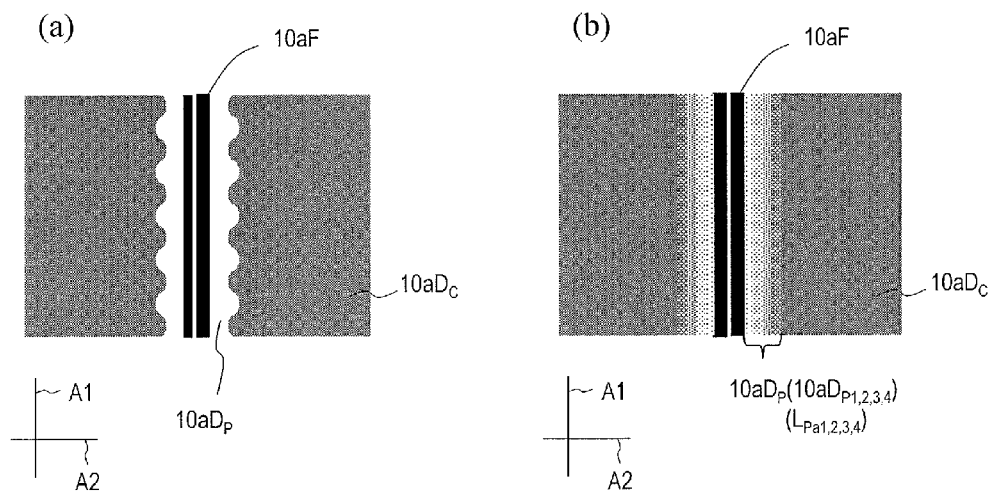
FIG. 3 (a) and (b) are schematic diagrams for describing another peripheral display region constitution which is applicable to the liquid crystal display device 100.

Next, with reference to FIGS. 2(a) and (b), specific examples will be illustrated. Note that the image shown in FIG. 2 is a portion of the reference image "N2 flowers" from The Institute of Image Electronics Engineers of Japan (http://wwwsoc.nii.ac.jp/iieej/trans/scid-new.html).

Herein, a multi display system (hereinafter simply referred to as a "liquid crystal display device") in which 60V-type liquid crystal display panels are employed, which was disclosed earlier by the Applicants, will be illustrated as an example. The joint region of this liquid crystal display device has a width $d_J$ (system frame width) of 6.5 mm. The above-described conditions for obscuring this joint region are specifically shown in Table 1. This is directed to the case where $d_{Pa}=d_{Pb}$ and $\alpha=(d_{Pa}+d_{Pb})/d_J$. Since the width of the peripheral display region $10aD_P$, $10bD_P$ takes a value which is an integer multiple of the pixel pitch ($P_X$) along the row direction, Table 1 shows the width $d_{Pa}=d_{Pb}$ in terms of a multiple (positive integer) of the pixel pitch $P_X$ along the row direction, length (unit: mm), and an $\alpha$ expression. The pixel pitch $P_X$ along the row direction is 0.97275 mm. As described earlier, $\alpha$ preferably satisfies $1.00<\alpha<4.00$, and more preferably satisfies $1.00<\alpha<2.00$. Expressing this as a multiple of the pixel pitch $P_X$ along the row direction, it is preferable that $4P_X \leq d_{Pa}$, $d_{Pb} \leq 13P_X$, and more preferable that $4P_X \leq d_{Pa}$, $d_{Pb} \leq 6P_X$. In this situation, the luminance ratio $L_{Pa}/L_{Ca}(=L_{Pb}/L_{Cb})$ is less than 2.00, whereby the peripheral display region is restrained from becoming conspicuous. Note that the "pixel" here is composed of three "subpixels" respectively presenting the primary colors of red (R), green (G), and blue (B). It will be appreciated that the embodiments according to the present invention are not limited to a pixel which is composed of three primary colors, but are also applicable to any multiprimary pixel which is composed of four or more primary colors.

TABLE 1

| $d_{Pa}=d_{Pb}$ multiple of pixel pitch $P_X$ | $d_{Pa}=d_{Pb}$ [mm] | $\alpha$ $(d_{Pa}=d_{Pb})/d_J$ | luminance ratio $L_{Pa}/L_{Ca}$ |
|---|---|---|---|
| 1 | 0.97275 | 0.30 | 4.34 |
| 2 | 1.9455 | 0.60 | 2.67 |
| 3 | 2.91825 | 0.90 | 2.11 |
| 4 | 3.891 | 1.20 | 1.84 |
| 5 | 4.86375 | 1.50 | 1.67 |
| 6 | 5.8365 | 1.80 | 1.56 |
| 7 | 6.80925 | 2.10 | 1.48 |
| 8 | 7.782 | 2.40 | 1.42 |
| 9 | 8.75475 | 2.70 | 1.37 |
| 10 | 9.7275 | 3.00 | 1.33 |
| 11 | 10.70025 | 3.30 | 1.30 |
| 12 | 11.673 | 3.60 | 1.28 |
| 13 | 12.64575 | 3.90 | 1.26 |
| 14 | 13.6185 | 4.20 | 1.24 |
| 15 | 14.59125 | 4.48 | 1.22 |

For example, given that the width of the peripheral display regions $10aD_P$ and $10bD_P$ is $6P_X$, then $d_{Pa}$ and $d_{Pb}$ are each 5.8365 mm. In this case, the luminance of each pixel among the six pixels (six pixel columns) contained in the peripheral display regions $10aD_P$ and $10bD_P$ that corresponds to given input image data may be made 1.56 times the luminance of each pixel in the middle display regions $10aD_C$ and $10bD_C$ that corresponds to the given input image data. In other words, assuming that a standard luminance (a luminance when not performing the luminance adjustment according to the present embodiment) which corresponds to the input image data shown in FIG. 2(b) is $L_{Ca}'$ (luminance of a pixel in the middle display region) and $L_{Pa}'$ (luminance of a pixel in the peripheral display region), then, as illustrated in FIG. 2(a), the following may be adopted for example: (case 1) $L_{Pa}=L_{Pa}'$ and $L_{Ca}=L_{Ca}'/1.56$, or, conversely: (case 2) $L_{Pa}=1.56 \cdot L_{Pa}'$ and $L_{Ca}=L_{Ca}'$. Case 2 is preferable from the standpoint of power consumption. The reason for this will be set forth below.

The luminance of each pixel of a transmission-type liquid crystal display device (the luminance of the unit-display region is in proportion to the luminance of a pixel) is expressed as a product between the transmittance of a pixel of the liquid crystal display panel and the backlight luminance. Therefore, a highest luminance is attained when the backlight luminance is largest and the pixel transmittance is largest. In a commonly-available liquid crystal television set, this highest luminance is set at 400 to 600 cd/m². The luminance relationship under case 1 above can be easily realized by adjusting the pixel transmittance. However, in this case, the luminance $L_{Ca}$ of the middle display region will be 1/1.56 times the original luminance, which in itself will induce dark displaying.

Therefore, the (overall) backlight luminance may be made 1.56 times higher, thereby bringing up the luminance of the middle display region, which accounts for a large part of the display region, to the original luminance. This realizes case 2. However, this method will increase power consumption. Accordingly, a backlight is prepared such that light which is emitted from the backlight and enters the peripheral display regions $10aD_P$ and $10bD_P$ has a higher luminance than the luminance of light which is emitted from the backlight and enters the middle display regions $10aD_C$ and $10bD_C$. By doing this, the increase in power consumption, which only corresponds to the increased backlight luminance for emitting the light toward the peripheral display regions $10aD_P$ and $10bD_P$, will be smaller than in the aforementioned method. Specifically, in the case of a direct-type backlight, this can be realized by increasing the voltage to be supplied to the light sources (LEDs or CCFLs) corresponding to the peripheral display regions $10aD_P$ and $10bD_P$, or by increasing the density with which light sources are deployed. In the case of an edge light type in which a light guide is used, known methods (e.g., increasing the density of prisms and scatterers in the light guide) can be utilized to increase the backlight luminance in the relevant regions. Moreover, recent liquid crystal television sets adopt a so-called local dimming technique which adjusts the backlight luminance in accordance with the displayed image, this being in order to attain an enhanced image contrast ratio. In such a liquid crystal display device which has the function of adjusting the luminance distribution of the backlight, case 2 can be easily realized by merely modifying the software.

In the above description, the peripheral display regions $10aD_P$ and $10bD_P$ are such that their respective widths $d_{Pa}$ and $d_{Pb}$ keep along the first axis A1 with a constant value; however, the shape of the peripheral display regions $10aD_P$ and $10bD_P$ is not limited to this. For example, as shown in FIG. 3(a), the peripheral display regions $10aD_P$ and $10bD_P$ may have varying width along the first axis A1. For example, the edge of the peripheral display region $10aD_P$ flush to the middle display region $10aD_C$ and the edge of the peripheral display region $10bD_P$ flush to the middle display region $10bD_C$ may be undulated along the first axis A1 (e.g., a sine wave). By doing this, the boundary between the peripheral display region $10aD_P$ and the middle display region $10aD_C$ and the boundary between the peripheral display region $10bD_P$ and the middle display region $10bD_C$ is obscured. For example, the amplitude may be about ⅕ to ½ times the width $d_{Pa}$, and the period may be about twice the $d_{Pa}$.

Moreover, as shown in FIG. 3(b), the luminance distribution of the middle display region $10aD_C$ at the peripheral display region $10aD_P$ may have a gradient. In other words, a luminance distribution may be created so that a luminance of the peripheral unit-display region that corresponds to input image data of a given gray scale level will be higher at the frame region side and lower at the middle display region side. For example, as shown in FIG. 3(b), the peripheral display region may be divided into a plurality of subregions $10aD_{P1}$, $10aD_{P2}$, $10aD_{P3}$, and $10aD_{P4}$ which are arranged along the second axis A2, the peripheral unit-display region having the same luminance within each subregion, such that the luminance of the peripheral unit-display region becomes higher in subregions which are closer to the frame region $10aF$ and that the luminance of the peripheral unit-display region becomes lower in subregions which are closer to the middle display region $10aD_C$ ($L_{Pa1} > L_{Pa2} > L_{Pa3} > L_{Pa4}$). Moreover, without being limited to four, the number of subregions may be appropriately set, and the subregions do not need to be equal in width.

Figure 4:
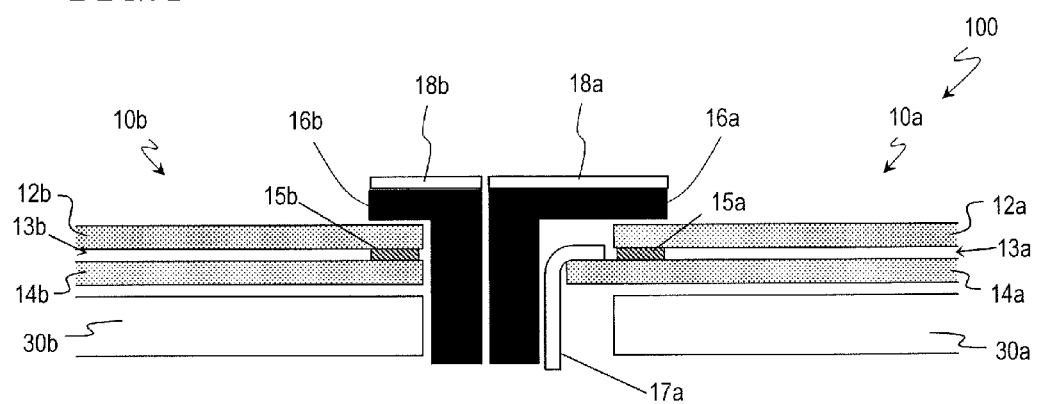
FIG. 4 A schematic diagram showing a cross-sectional structure near a joint in the liquid crystal display device 100.

FIG. 4 schematically shows a cross-sectional structure near a joint in the liquid crystal display device 100.

The liquid crystal display panel 10a of the liquid crystal display device 100 includes a counter substrate 12a having color filters, a TFT substrate 14a, and a liquid crystal layer 13a provided between the counter substrate 12a and the TFT substrate 14a, for example. The counter substrate 12a and the TFT substrate 14a adhere at a sealing portion 15a. At the end of the TFT substrate 14a closer to the joint, a flexible printed wiring board (FPB) 17a for providing connection to external circuitry is connected. A housing 16a is provided so as to cover the frame region of the liquid crystal display panel 10a. An antireflection film 18a is provided on the face of the housing 16a at the viewer's side. The housing 16a is made of black plastic (e.g., acrylic resin), for example, and the antireflection film 18a is a photocurable resin film having a moth-eye structure on its surface, for example.

Similarly to the liquid crystal display panel 10a, the liquid crystal display panel 10b also includes a counter substrate 12b having color filters, a TFT substrate 14b, and a liquid crystal layer 13b provided between the counter substrate 12b and the TFT substrate 14b, for example. The counter substrate 12b and the TFT substrate 14b adhere at a sealing portion 15b. No flexible substrate is provided at the end of the liquid crystal display panel 10b closer to the joint. Therefore, the width (corresponding to $d_{Fb}$ in FIG. 1(b)) of the face of the housing 16b at the viewer's side, which is disposed so as to cover the frame region of the liquid crystal display panel 10b, is narrower than the width (corresponding to $d_{Fa}$ in FIG. 1(b)) of the face of the housing 16a at the viewer's side, which is disposed so as to cover the frame region of the liquid crystal display panel 10a. It is often the case that the terminal portion of a liquid crystal display panel (a portion of the liquid crystal display panel 10a that is connected to an FPB 17a) is provided at only one end along the horizontal direction of the liquid crystal display panel. Therefore, as is illustrated herein, the width ($d_{Fa}$, $d_{Fb}$) of the frame region will generally be asymmetric. However, as mentioned above, the width ($d_{Pa}$, $d_{Pb}$) of the peripheral display region may be varied so as to adapt to the frame region, and the peripheral display regions of an equal width may be provided symmetrically with respect to the joint region (which includes two frame regions and a linking portion).

Figure 5:
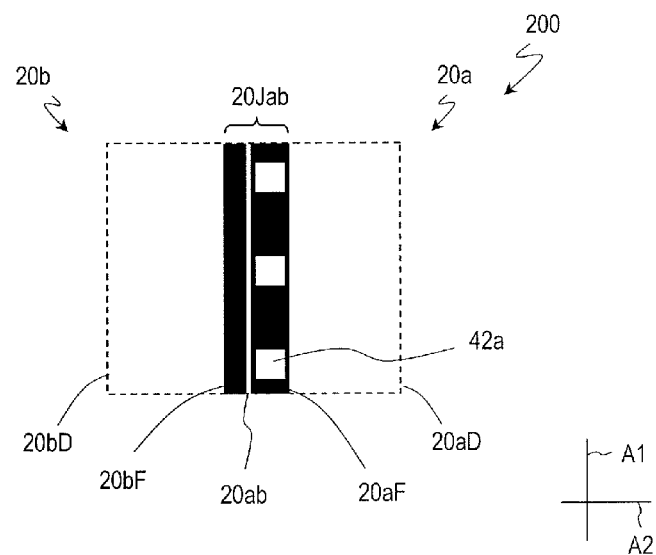
FIG. 5 A plan view showing the structure near a joint in a liquid crystal display device 200 according to a second embodiment of the present invention.
Figure 6:
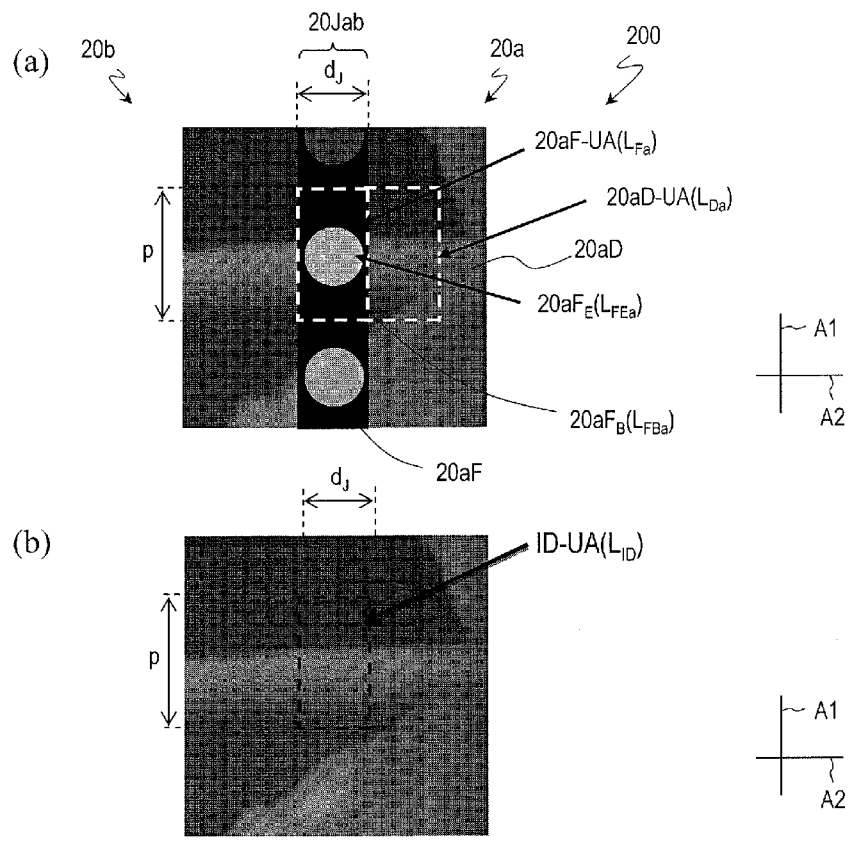
FIG. 6 (a) is a diagram showing an example of luminance distribution near a joint region of the liquid crystal display device 200; and (b) is a diagram showing an image to be displayed in the region indicated in (a) (a standard luminance distribution corresponding to input image data).

Next, with reference to FIG. 5 and FIG. 6, the fundamental structure of a liquid crystal display device 200 according to a second embodiment of the present invention as well as the operation thereof will be described.

The liquid crystal display device 200 includes: a display panel 20a having a display region 20aD and a frame region 20aF, the frame region 20aF being formed outside the display region 20aD and extending along the first axis A1; a display panel 20bD having a display region 20bD and a frame region 20bF, the frame region 20bF being formed outside the display region 20bD and extending along the first axis A1; a linking portion 20ab which links together the frame region 20aF of the display panel 20a and the frame region 20bF of the display panel 20b; and a joint region 20Jab, which includes the frame region 20aF and the frame region 20bF. The liquid crystal display device 200 further includes a plurality of light sources 42a which are provided in the frame region 20aF. Although an example where the light sources 42a are disposed only in the frame region 20aF is illustrated herein, this is not a limitation; a plurality of light sources may be provided only in the frame region 20bF. By adjusting the luminance of the plurality of light sources 42a disposed in the frame region 20aF, the liquid crystal display device 200 ensures that the luminance of the joint region 20Jab, which would conventionally appear black, becomes closer to the luminance of the display region, thereby obscuring the joint region 20Jab.

Herein, the plurality of light sources 42a are arranged at a constant pitch along the first axis A1. This constitution permits control of the luminance of the constant regions (frame unit-regions) which are arranged at a constant pitch, thereby being able to obscure the frame region.

As described earlier, the unit-region is a region (area) of variable luminance, and defines the smallest region (area) that serves as a reference in making luminance comparison with another region. The unit-regions in the liquid crystal display device of the first embodiment are the unit-display region, which is a pixel region, and the frame unit-region having the same geometric area as a pixel region. On the other hand, the unit-regions in the liquid crystal display device of the second embodiment are: a region (frame unit-region) whose luminance is adjusted by each of the plurality of light sources 42a which are arrayed in the frame region 20aF; and a region (unit-display region) within the display region that has the same geometric area as the frame unit-region. The reason is that, generally speaking, it is difficult to arrange a plurality of light sources in the frame region in such a manner that the frame unit-region will be smaller than a pixel region. In the case where a plurality of light sources 42a are disposed in only one of the frame regions 20aF and 20bF of the two liquid crystal display panels 20a and 20b composing the joint region 20Jab as shown in FIG. 5, for example, a joint unit-region may be considered, rather than the frame unit-region. Since the unit-display region can only have a geometric area which is an integer multiple of a pixel region, it might not be possible to define a region which is precisely equal in geometric area to the frame unit-region (joint unit-region); however, it will suffice to designate the unit-display region with a geometric area which is the closest possible to the geometric area of the frame unit-region (joint unit-region).

With reference to FIGS. 6(a) and (b), a method of adjusting the luminance of each region for obscuring the joint in the liquid crystal display device 200 of the second embodiment will be described.

FIG. 6(a) is a diagram showing an example of luminance distribution near a joint region in the liquid crystal display device 200. For simplicity, a case will be illustrated where the frame region 20aF of the liquid crystal display panel 20a accounts for the entire joint region 20Jab.

In FIG. 6(a), regions corresponding to the light-emitting sections of the plurality of light sources 42a disposed in the joint region 20Jab (=frame region 20aF) are denoted as $20aF_E$ (average luminance: $L_{FEa}$), whereas any region excluding the regions corresponding to the light-emitting sections within the joint region 20Jab is denoted as $20aF_B$ (average luminance: $L_{FBa}$). The joint region 20Jab has a width $d_J$, and the light sources 42a are arranged along the first axis A1 at a pitch p. The joint unit-region (frame unit-region) 20aF-UA (average luminance: $L_{Fa}$) is a region indicated as a rectangle with a vertical length p and a horizontal length $d_J$. An average luminance $L_{Fa}$ of the joint unit-region (frame unit-region) 20aF-UA is expressed as $[(L_{FEa} \cdot S) + \{L_{FBa} \cdot (p \cdot d_J)\}]/(p \cdot d_J)$, assuming that a region $20aF_E$ corresponding to a light-emitting section has a geometric area S. When $L_{FBa}$ is zero, $L_{Fa} = (L_{FEa} \cdot S)/(p \cdot d_J)$. Assuming that $\beta = S/(p \cdot d_J)$, this is expressed as $L_{Fa} = \beta \cdot L_{FEa}$.

FIG. 6(b) is a diagram showing an image to be displayed in the region indicated in FIG. 6(a) (a standard luminance distribution corresponding to input image data). In FIG. 6(b), a region ID-UA indicated by a rectangle with a vertical length p and a horizontal length $d_J$ is the unit-display region. Therefore, by adjusting the average luminance $L_{Fa}$ of the joint unit-region (frame unit-region) 20aF-UA so as to equal an average luminance $L_{ID}$ of the region ID-UA, the joint region 20Jab can be obscured ($L_{Fa} = L_{ID}$). The luminance of an average luminance $L_{Da}$ of the unit-display region 20aD-UA is equal to the average luminance $L_{ID}$ of the region ID-UA. Stated otherwise, it is possible to obscure the joint region 20Jab ($L_{Fa} = L_{Da}$) by adjusting the average luminance $L_{Fa}$ of the plurality of joint unit-regions 20aF-UA contained in the joint region (frame region) 20Jab is equal to the average luminance $L_{Da}$ of the unit-display regions 20aD-UA contained in the display region 20aD, corresponding to input image data of a given gray scale level. Since $L_{Fa} = \beta \cdot L_{FEa}$ as mentioned earlier, it follows that $L_{FEa}$ may be adjusted so that $L_{Da} = \beta \cdot L_{FEa}$, in accordance with $\beta$.

Table 2 below shows a luminance ratio $L_{FEa}/L_{Da}$ of a liquid crystal display device ($d_J$=6.5 mm) in which the same 60V-type liquid crystal display panels as the aforementioned are used, where light sources (e.g., LEDs) with varying $\beta$ are arranged at various pitches p. Table 2 also shows the number of light sources required per 60V-type liquid crystal display panel. For example, light-emitting diodes NSSM065 manufactured by Nichia CORPORATION (chip size: 3.0 mm×3.3 mm, light-emitting section: 2.6 mm□) can be used. The light-emitting diode NSSM065 is an LED which includes respective light-emitting elements of R, G, and B, and allows the respective luminances of R, G, and B to be separately adjusted; therefore, it permits emission luminance and chromaticity adjustments in accordance with an image to be displayed or an image to be displayed in an adjacent region.

By disposing the light sources and adjust luminance so that the conditions shown in Table 2 are satisfied, the joint region 20Jab can be obscured. This effect is enhanced by increasing the number of light sources (i.e., increasing the installation density of the light sources).

In order to attain an equal density to that of the pixel regions, i.e., so that the frame unit-region will be identical to a pixel region, the number of light sources required to arrange a plurality of light sources in a matrix array over the entire joint region having a width $d_J$ of 6.5 mm will be about 12000 per 60V-type liquid crystal display panel. As such light sources, for example, PICOLED manufactured by ROHM Co., Ltd. (package size, 1 mm×1 mm×thickness 0.2 mm) can be used. Although adopting such a constitution will excel in display quality, it will also induce a problem in that a complicated circuit is required for driving the LEDs, or that large costs are incurred for the LEDs and their implementation.

Therefore, the array pitch p of the light sources may be set in accordance with the required display quality and/or cost. Although the preferable pitch p depends on the distance at which the liquid crystal display device is viewed, it is generally preferable that the pitch p is no less than the width $d_J$ being multiplied by one, and no more than the joint region 20Jab being multiplied by three.

TABLE 2

| array pitch of light sources p [mm] | β | luminance ratio $L_{FEa}/L_{Da}$ | number of light sources (per 60 V-type panel) |
|---|---|---|---|
| 4.0 | 0.26 | 3.85 | 1041 |
| 5.0 | 0.21 | 4.81 | 833 |
| 6.0 | 0.17 | 5.77 | 694 |
| 7.0 | 0.15 | 6.73 | 595 |
| 8.0 | 0.13 | 7.69 | 521 |
| 9.0 | 0.12 | 8.65 | 463 |
| 10.0 | 0.10 | 9.62 | 417 |

Figure 7:
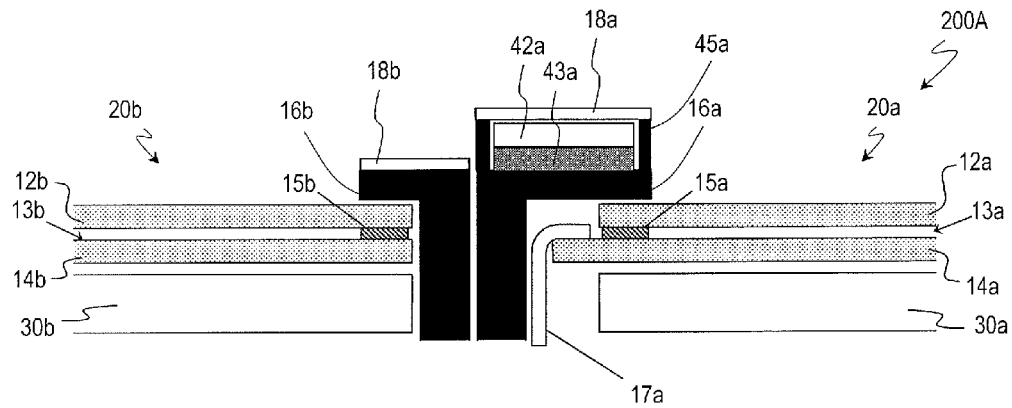
FIG. 7 A schematic diagram showing a cross-sectional structure near a joint in the liquid crystal display device 200A.
Figure 8:
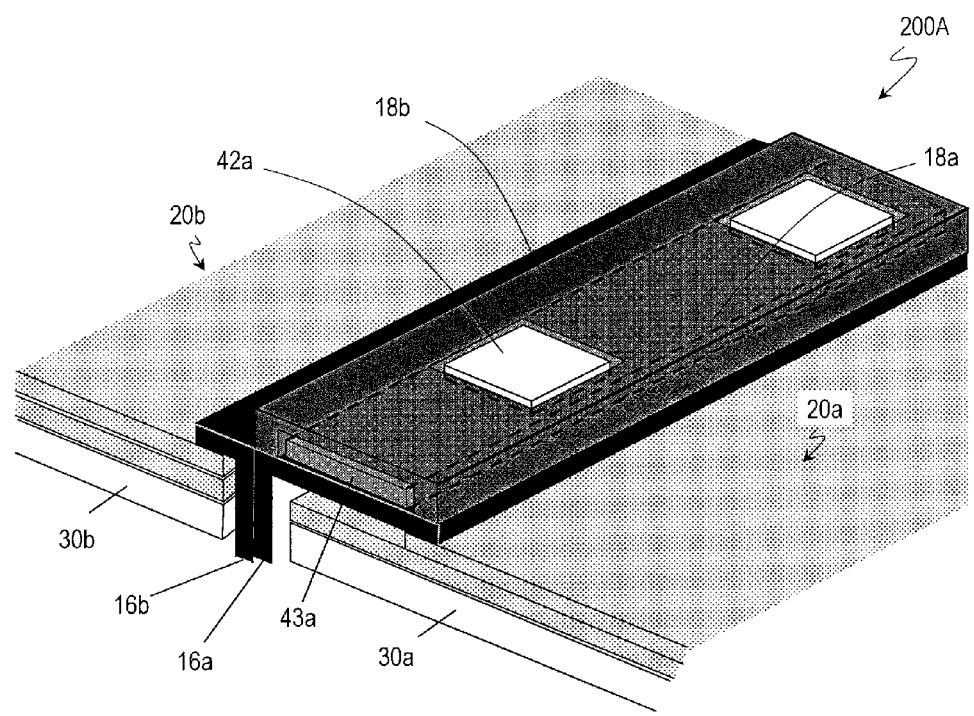
FIG. 8 A perspective view near a joint in the liquid crystal display device 200A.

FIG. 7 and FIG. 8 schematically show the structure of the liquid crystal display device 200A of the second embodiment. FIG. 7 is a diagram schematically showing a cross-sectional structure near a joint, and FIG. 8 is a perspective view. The liquid crystal display panels 20a and 20b of the liquid crystal display device may be identical to the liquid crystal display panels 10a and 10b of the liquid crystal display device 100, for example, and their description is omitted here. In the following, any component element having a substantially identical counterpart in the liquid crystal display device 100 will be denoted by a like reference numeral, and the description thereof may be omitted.

On the face of the housing 16a facing the viewer, the liquid crystal display device 200A includes LEDs 42a which are mounted on a mounting substrate 43a. The LEDs 42a are protected by a surrounding cover member 45a, and an anti-reflection film 18a is disposed over the LEDs 42a. The liquid crystal display device 200A is able to operate in substantially similar manners to the above-described liquid crystal display device 200, and thus the joint region can be obscured.

FIGS. 9(a) and (b) schematically show the structure of a liquid crystal display device 200B. FIG. 9(a) is a plan view of the liquid crystal display device 200B, and FIG. 9(b) is a schematic cross-sectional view along line 9B-9B' in FIG. 9(a).

Similarly to the liquid crystal display device 200A, the liquid crystal display device 200B includes LEDs 42a which are disposed on the face of a housing 16a facing the viewer, and further includes LEDs 42b disposed on the face of a housing 16b facing the viewer, the housing 16b being disposed so as to cover the frame region of the liquid crystal display panel 20b. The LEDs 42b are mounted on a mounting substrate 43b, with a cover member 45b being provided on the mounting substrate 43b. As shown in FIG. 9(a), the LEDs 42b are arranged at a constant pitch similarly to the LEDs 42a, but the array of the LEDs 42a and the array of the LEDs 42b are offset by a half pitch. By adopting such an arrangement, it becomes possible to obscure the joint region more efficiently.

Figure 10:
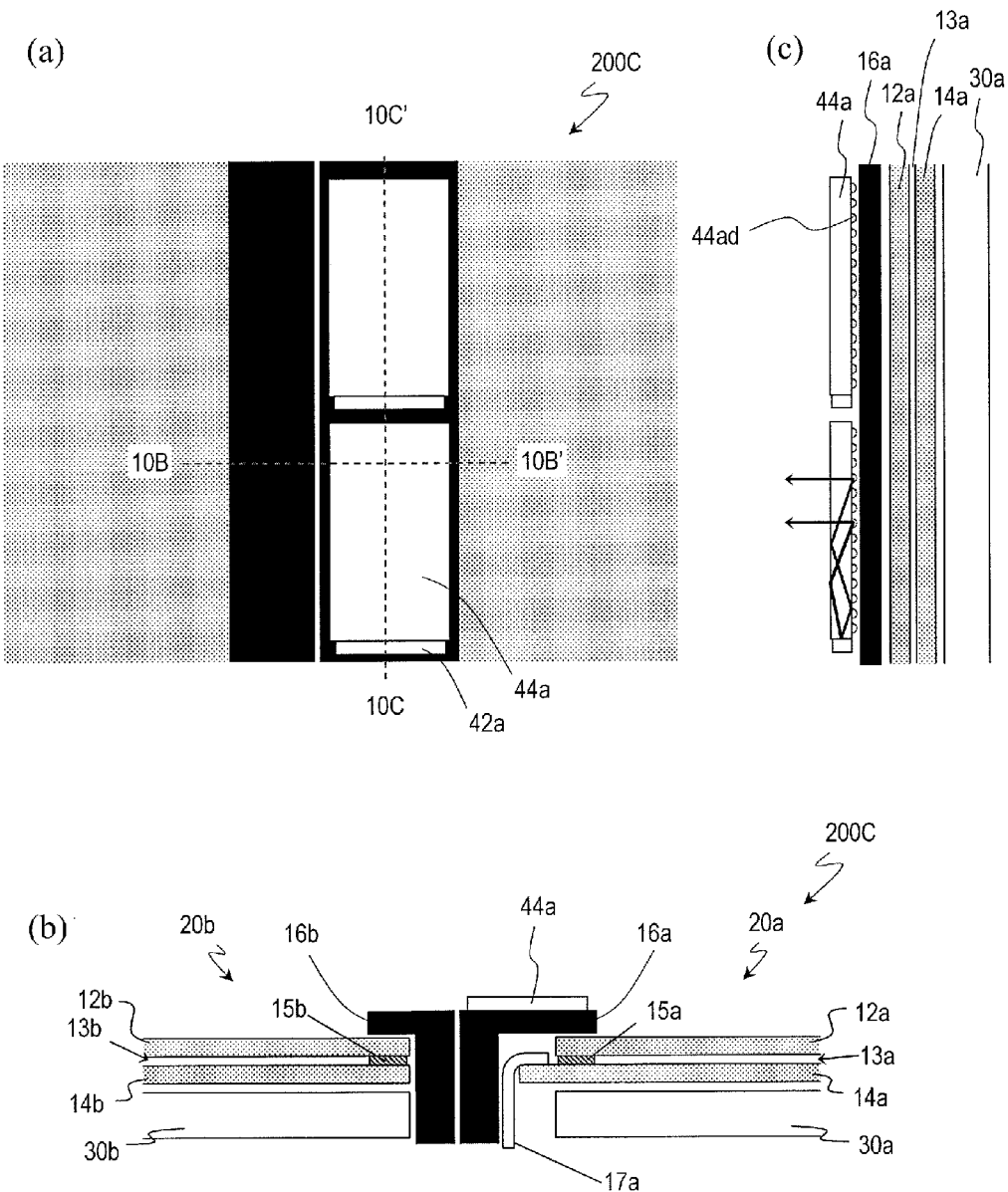
FIG. 10 (a) is a plan view of a liquid crystal display device 200C; (b) is a schematic cross-sectional view along line 10B-10B' in (a); and (c) is a schematic cross-sectional view along line 10C-10C' in (a).

FIGS. 10(a) to (c) schematically show the structure of a liquid crystal display device 200C. FIG. 10(a) is a plan view of the liquid crystal display device 200C; FIG. 10(b) is a schematic cross-sectional view along line 10B-10B' in FIG.

10(a); and FIG. 10(c) is a schematic cross-sectional view along line 10C-10C' in FIG. 10(a).

Instead of the LEDs 42a of the liquid crystal display device 200A, the liquid crystal display device 200C includes sets of LEDs 42a and light guides 44a. Therefore, the number of LEDs 42a included in the liquid crystal display device 200C is smaller than the number of LEDs 42a included in the liquid crystal display device 200A. Each light guide 44a is a light guide for edge lighting, and has bumps 44ad on the rear face of the light guide 44a (the face of the housing 16a facing the viewer) for diffusing light. As is well known, the intensity distribution of light which is emitted from the light guide 44a can be adjusted based on the size and density of the bumps 44ad. Without being limited to the above, various known light guides can be used for the light guides 44a.

The first embodiment and the second embodiment may be combined as appropriate (third embodiment).

Figure 11:
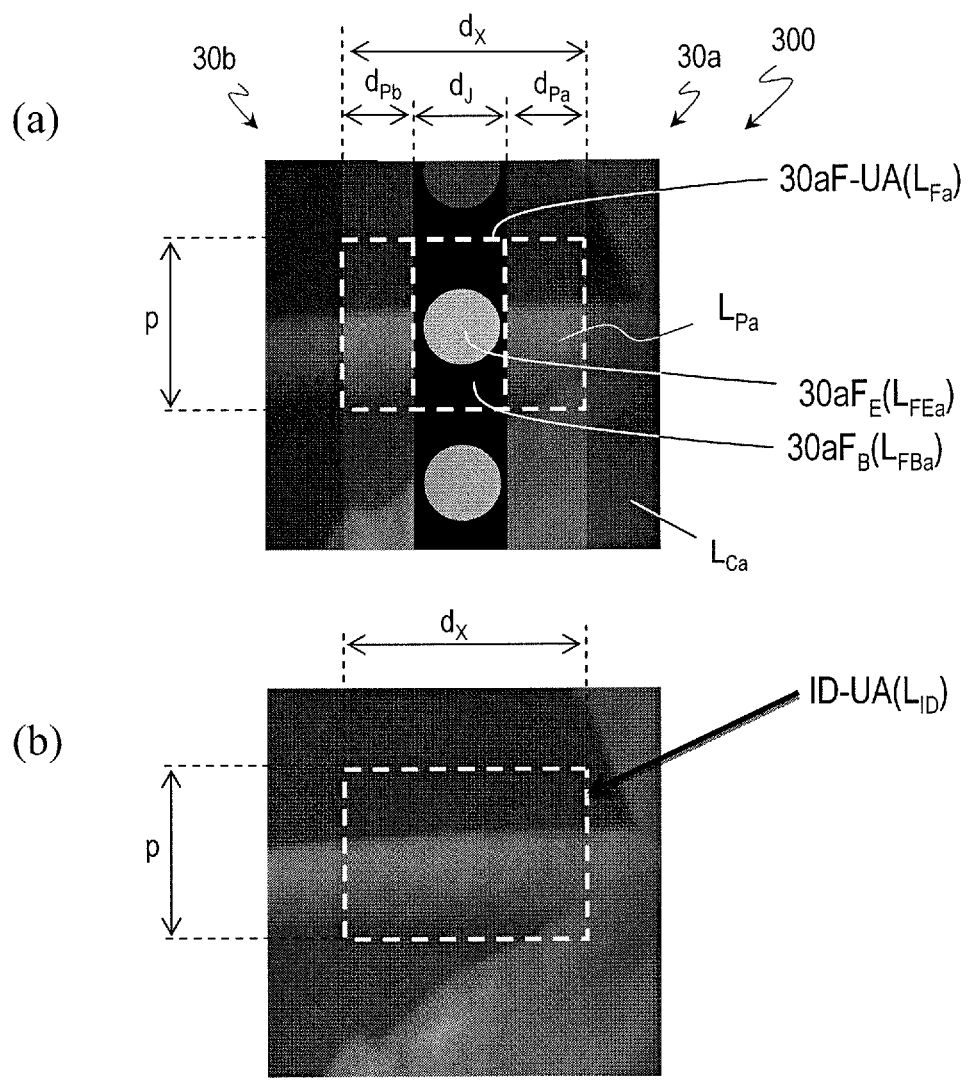
FIG. 11 (a) is a diagram showing an example of luminance distribution near a joint region of a liquid crystal display device 300; and (b) is a diagram showing an image to be displayed in the region indicated in (a) (a standard luminance distribution corresponding to input image data).

For example, the liquid crystal display device 300 shown in FIG. 11 includes liquid crystal display panels 30a and 30b, and has a peripheral display region as does the liquid crystal display device 100 of the first embodiment, and includes a plurality of light sources in the joint region as does the liquid crystal display device 200 of the second embodiment. Assuming an average luminance $L_{Fa}$ of the frame unit-region 30aF-UA of the frame region in which the light sources are disposed, the luminance of each region is preferably adjusted so that the relational expression $(L_{Fa} \cdot d_{Fa} + L_{Pa} \cdot d_{Pa})/(d_{Fa} + d_{Pa}) = L_{Ca}$ is satisfied. In other words, it is adjusted so that an average between an average luminance of the frame unit-regions 30aF-UA in the frame region in which the light sources are disposed and an average luminance $L_{Pa}$ of the peripheral unit-display regions is equal to an average luminance $L_{Ca}$ of the middle unit-display regions. The average luminance $L_{Fa}$ of the frame unit-regions 30aF-UA is determined as an area-weighted average between the regions $30aF_E$ corresponding to the light-emitting sections (average luminance: $L_{FEa}$) and the remainder of the frame region $30aF_B$ (average luminance: $L_{FBa}$), as described earlier.

Now, a rectangular region composed of a joint unit-region and two peripheral unit-display regions flanking it, the rectangular region having a vertical length p and a horizontal length $d_x$, may be regarded as one unit-region, and an average luminance of such unit-regions may be made equal to an average luminance (ID-UA (average luminance: $L_{ID}$) in FIG. 11(b)) of an image to be displayed in the unit-region indicated in FIG. 11(b) (a standard luminance distribution corresponding to input image data). This can be realized by, for example, increasing the luminance of the backlight which is radiated on the peripheral display region, as has been described with respect to the liquid crystal display device 100 of the first embodiment.

This provides an advantage in that the average luminance of the peripheral unit-display region or the frame unit-region can be lowered than when adopting either one of a constitution where the average luminance of the peripheral unit-display regions is increased according to the first embodiment, or a constitution where an average luminance of the frame unit-regions is increased according to the second embodiment.

Note that whether the joint region is observed or not will depend on the viewing distance. Moreover, when the luminance of the peripheral display region or the joint region is adjusted as described above, the peripheral display region or the joint region may become conspicuous when viewed at a short distance, e.g., closer than about 1 m in the aforementioned case of employing 60V-type liquid crystal display panels. In order to prevent this, a motion sensor (e.g., an infrared sensor) may be provided in the liquid crystal display device, and a usual displaying operation may be carried out when it is known from the motion sensor that a person has come closer to the liquid crystal display device than the predetermined distance; that is, the displaying operation which involves increasing the luminance of the peripheral display region and/or the luminance of the joint region may be avoided.

Industrial Applicability

The present invention is broadly applicable to display devices, and in particular to direct-viewing type display devices.

REFERENCE SIGNS LIST 10a, 10b, 10c, 10d liquid crystal display panel
10aD display region
10aF first frame region
10a$D_P$ first peripheral display region
10a$D_C$ first middle display region
10bD display region
10bF second frame region
10b$D_P$ second peripheral display region
10b$D_C$ second middle display region
10ab linking portion
10Jab joint region
100 liquid crystal display device

The invention claimed is:

1. A display device comprising:
a first display panel having a first display region and a first frame region formed outside the first display region, the first frame region extending along a first axis;
a second display panel having a second display region and a second frame region formed outside the second display region, the second frame region extending along the first axis;
a joint region containing, a linking portion, the first frame region of the first display panel, and the second frame region of the second display panel, the linking, portion linking together the first frame region and the second frame region, wherein
the first display region has a first peripheral display region which adjoins the first frame region along a second axis intersecting the first axis, and a first middle display region which adjoins the first peripheral display region along the second axis;
the second display region has a second peripheral display region which adjoins the second frame region along the second axis and a second middle display region which adjoins the second peripheral display region along the second axis;
each of the first display region, the second display region, the first frame region, and the second frame region has a plurality of unit-regions, each unit-region being a region of variable luminance and defining a smallest region that serves as a reference in making luminance comparison with another region;
an average luminance of a plurality of first peripheral unit-display regions contained in the first peripheral display region, corresponding to input image data of a given gray scale level, is higher than an average luminance of a plurality of first middle unit-display regions contained in the first middle display region; and
(LFa·dFa+LPa·dPa)/(dFa+dPa)=LCa is satisfied where, corresponding to input image data of a given gray scale level, LCa is an average luminance of the plurality of first middle unit-display regions; LPa is an average luminance of the plurality of first peripheral unit-display regions; dPa is an average width of the first peripheral display region; LFa is an average luminance of a plurality of first frame unit-regions contained in the first frame region; and dFa is an average width of the first frame region.

2. The display device of claim 1, wherein the relationship dFa<dPa<4dFa is satisfied.

3. The display device of claim 1, wherein, corresponding to input image data of a given gray scale level, an average luminance of a plurality of second peripheral unit-display regions contained in the second peripheral display region is higher than an average luminance of a plurality of second middle unit-display regions contained in the second middle display region.

4. The display device of claim 3, wherein (LFb·dFb+LPb·dPb)/(dFb+dPb)=LCb is satisfied where, corresponding to input image data of a given gray scale level, LCb is an average luminance of the plurality of second middle unit-display regions; LPb is an average luminance of the plurality of second peripheral unit-display regions; dPb is an average width of the second peripheral display region; LFb is an average luminance of a plurality of second frame unit-regions contained in the second frame region, and dFb is an average width of the second frame region.

5. The display device of claim 4, wherein the relationship dFb<dPb<4dFb is satisfied.

6. The display device of claim 4, wherein the relationships dJ/2<dPa<2dJ and dJ/2<dPb<2dJ are satisfied where dJ is an average width of the joint region.

7. The display device of claim 1, wherein, corresponding to input image data of a given gray scale level, the plurality of first peripheral unit-display regions have a distribution of luminance which is higher toward the first frame region and lower toward the first middle display region.

8. The display device of claim 7, wherein
the display device further includes a backlight; and
light being emitted from the backlight and entering the first peripheral display region has a luminance which is higher than a luminance of light being emitted from the backlight and entering the first middle display region.

9. The display device of claim 1, wherein the first frame region and the second frame region are black and antireflection-treated.

10. The display device of claim 1, further comprising a motion sensor.

11. A display device comprising:
a first display panel having a first display region and a first frame region formed outside the first display region, the first frame region extending along a first axis;
a second display panel having a second display region and a second frame region formed outside the second display region, the second frame region extending along the first axis;
a joint region containing a linking portion, the first frame region of the first display panel, and the second frame region of the second display panel, the linking portion linking together the first frame region and the second frame region, wherein
the first display region has a first peripheral display region which adjoins the first frame region along a second axis intersecting the first axis, and a first middle display region which adjoins the first peripheral display region along the second axis;
the second display region has a second peripheral display region which adjoins the second frame region along the second axis and a second middle display region which adjoins the second peripheral display region along the second axis;
each of the first display region, the second display region, the first frame region, and the second frame region has a plurality of unit-regions, each unit-region being a region of variable luminance and defining, a smallest region that serves as a reference in making luminance comparison with another region;
an average luminance of a plurity of a first peripheral unit-display regions contained in the first peripheral display region, corresponding to input image data of a given gray scale level, is higher than an average luminance of a plurality of first middle unit-display regions contained in the first middle display region; and
the first peripheral display region has a varying width along the first axis.

* * * * *